United States Patent
Hu et al.

(10) Patent No.: US 8,974,617 B2
(45) Date of Patent: Mar. 10, 2015

(54) METHOD FOR TRANSFERRING A GRAPHENE SHEET TO METAL CONTACT BUMPS OF A SUBSTRATE FOR USE IN SEMICONDUCTOR DEVICE PACKAGE

(71) Applicants: IMEC, Leuven (BE); Taiwan Semiconductor Manufacturing Company, Ltd., HsinChu (TW)

(72) Inventors: Yu-Hsiang Hu, Heverlee (BE); Chung-Shi Liu, Tervuren (BE)

(73) Assignees: IMEC, Leuven (BE); Taiwan Semiconductor Manufacturing Company, Ltd., HsinChu (TW)

( * ) Notice: Subject to any disclaimer, the term of this patent is extended or adjusted under 35 U.S.C. 154(b) by 0 days.

(21) Appl. No.: 14/089,612

(22) Filed: Nov. 25, 2013

(65) Prior Publication Data

US 2014/0166194 A1   Jun. 19, 2014

(30) Foreign Application Priority Data

Dec. 18, 2012   (EP) .................................. 12197820

(51) Int. Cl.
*H01L 23/00*       (2006.01)
*G03F 7/00*        (2006.01)

(52) U.S. Cl.
CPC ............... *H01L 24/06* (2013.01); *H01L 24/11* (2013.01); *H01L 24/13* (2013.01); *H01L 24/14* (2013.01);
(Continued)

(58) Field of Classification Search
CPC ......... H01L 24/06; H01L 24/11; H01L 24/13; H01L 24/17; H01L 24/14; H01L 24/742
USPC ........ 156/212; 264/173.17, 320; 29/592, 599, 29/825; 257/76, 415, 746
See application file for complete search history.

(56) References Cited

U.S. PATENT DOCUMENTS

| 2008/0169563 A1 | 7/2008 | Awano et al. |
| 2010/0075493 A1 | 3/2010 | Ishikawa et al. |

(Continued)

FOREIGN PATENT DOCUMENTS

| WO | WO 02/11202 A2 | 2/2002 |
| WO | WO 2009/158552 A1 | 12/2009 |

OTHER PUBLICATIONS

Bie et al., "Site-Specific Transfer-Printing of Individual Graphene Microscale Patterns to Arbitrary Surfaces" *Adv. Mater.* 2011, 23, 3938-3943.

(Continued)

*Primary Examiner* — Jeff Aftergut
*Assistant Examiner* — Jayeun Lee
(74) *Attorney, Agent, or Firm* — Knobbe, Martens, Olson & Bear LLP

(57) ABSTRACT

A method is provided for transferring a graphene sheet to metal contact bumps of a substrate that is to be used in a semiconductor device package, i.e. a stack of substrates connected by said contact bumps, e.g., copper contact bumps for which graphene forms a protective layer. An imprinter device can be used comprising an imprinter substrate, said substrate being provided with cavities, whereof each cavity is provided with a rim portion. The imprinter substrate is aligned with the substrate comprising the bumps and lowered onto said substrate so that each bump becomes enclosed by a cavity, until the rim portion of the cavities cuts through the graphene sheet, leaving graphene layer portions on top of each of bumps when the imprinter is removed. The graphene sheet is preferably attached to the substrate by imprinting it into a passivation layer surrounding the bumps.

6 Claims, 7 Drawing Sheets

(52) U.S. Cl.
CPC ............ *H01L 24/17* (2013.01); *H01L 24/742* (2013.01); *H01L 24/98* (2013.01); *G03F 7/0002* (2013.01); *H01L 2224/17505* (2013.01); *H01L 2224/81902* (2013.01); *H01L 2224/29036* (2013.01); *H01L 2224/13693* (2013.01); *H01L 2224/11602* (2013.01); *H01L 2224/13541* (2013.01); *H01L 24/16* (2013.01); *H01L 24/81* (2013.01); *H01L 24/83* (2013.01); *H01L 24/92* (2013.01); *H01L 2224/02126* (2013.01); *H01L 2224/05026* (2013.01); *H01L 2224/05562* (2013.01); *H01L 2224/10126* (2013.01); *H01L 2224/11462* (2013.01); *H01L 2224/1147* (2013.01); *H01L 2224/1181* (2013.01); *H01L 2224/131* (2013.01); *H01L 2224/13147* (2013.01); *H01L 2224/13562* (2013.01); *H01L 2224/14051* (2013.01); *H01L 2224/14505* (2013.01); *H01L 2224/1703* (2013.01); *H01L 2224/2919* (2013.01); *H01L 2224/73104* (2013.01); *H01L 2224/73204* (2013.01); *H01L 2224/742* (2013.01); *H01L 2224/81193* (2013.01); *H01L 2224/81815* (2013.01); *H01L 2224/83191* (2013.01); *H01L 2224/83862* (2013.01); *H01L 2224/1182* (2013.01); *H01L 2224/111* (2013.01); *H01L 2224/81903* (2013.01); *H01L 2224/05572* (2013.01); *H01L 2224/1144* (2013.01)

USPC ........ 156/212; 264/173.17; 264/320; 29/592; 29/599; 29/825; 257/76; 257/415; 257/746

(56) References Cited

U.S. PATENT DOCUMENTS

| | | |
|---|---|---|
| 2010/0101710 A1 | 4/2010 | Choi et al. |
| 2011/0032684 A1 | 2/2011 | Hamatani et al. |
| 2011/0233767 A1 | 9/2011 | Sakurai |

OTHER PUBLICATIONS

Chen et al., "Oxidation Resistance of Graphene-Coated Cu and Cu/Ni Alloy", vol. 5,' No. 2,' 1321-1327,' 2011 ACSNANO, www.acsnano.org, Published online Jan. 28, 2011, 10/1021/nn103028d.

Mattevi et al., "A review of chemical vapour deposition of graphene on copper", J. Mater. Chem., 2011, 21, 3324-3334.

Rafiee et al., "Wetting transparency of graphene", Nature Materials, Advance Online Publication, www.nature.com/naturematerials, Published Online: Jan. 22, 2012, DOI: 10.1038/NMAT3228.

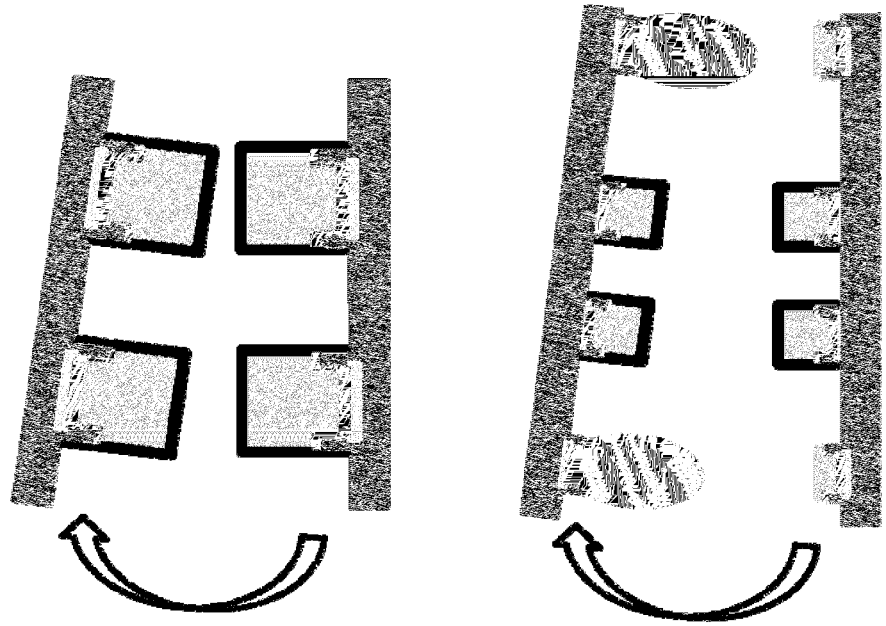
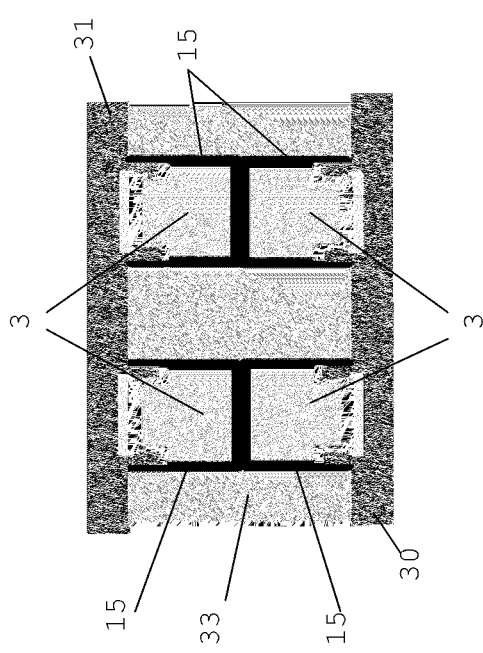
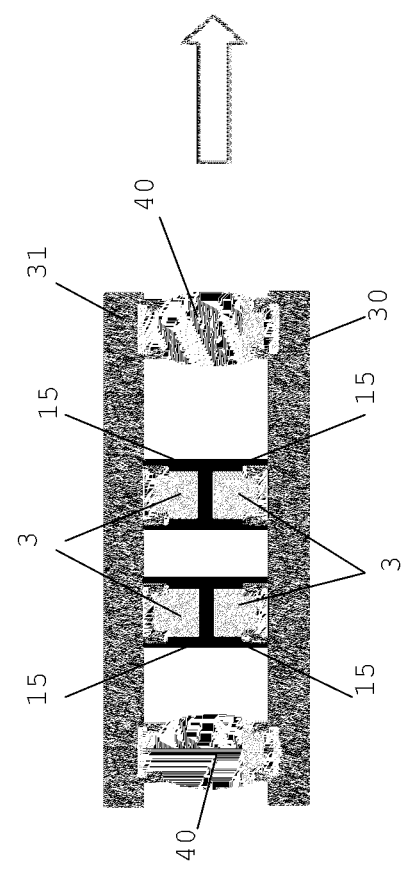
FIG. 4A
FIG. 4B

METHOD FOR TRANSFERRING A GRAPHENE SHEET TO METAL CONTACT BUMPS OF A SUBSTRATE FOR USE IN SEMICONDUCTOR DEVICE PACKAGE

INCORPORATION BY REFERENCE TO RELATED APPLICATION

Any and all priority claims identified in the Application Data Sheet, or any correction thereto, are hereby incorporated by reference under 37 CFR 1.57. This application claims the benefit of European Patent Application No. 12197820.9, filed Dec. 18, 2012, the disclosure of which is hereby expressly incorporated by reference in its entirety and is hereby expressly made a portion of this application.

FIELD OF THE INVENTION

Semiconductor device packaging techniques, in particular involving bonding methods using copper contact bumps, are provided, for example, techniques for establishing a contact between a device package and a carrier substrate.

BACKGROUND OF THE INVENTION

Copper is widely used in the semiconductor industry, but copper oxidation is a critical issue and needs to be prevented. In the assembly process, Cu is used to connect chip to chip, chip to substrate as Flip Chip bump or wire for wire bonding, etc. Generally, a flux agent is added as stand-alone material or embedded in the underfill to remove Cu oxidation during assembly. The use of a flux is however not preferred due to the flux residues that are hard to remove and generate reliability issues.

A known solution to prevent copper oxidation is the use of graphene. Graphene is a 2-dimensional hexagonal ring structure which can act as a membrane to prevent oxygen molecules from penetrating into a copper surface, therefore avoiding the copper oxidation reaction. Graphene consists of sp2-bonded carbon atoms with bond length approximately 1.42 angstroms smaller than copper (2.55 Å) and oxygen molecules (3.46 Å).

It is known to transfer a sheet of graphene by stamp techniques, as shown for example in 'Site-specific transfer-printing of individual graphene microscale patterns to arbitrary surfaces', Ya-Qing Bie et al, Advanced Materials 2011, 23, 3938-3943. This technique however requires a patterning step to create micro-stamps of graphene on PMMA supports and a complex transfer process involving a glass fiber controlled by a micromanipulator. Transferring larger graphene sheets to a surface is also known, as illustrated for example in 'A review of chemical vapor deposition of graphene on copper', Mattevi et al, Journal of Materials Chemistry, 2011, 21, 3324-3334. In the latter publication, transfer methods are described for transferring a sheet of graphene grown by CVD on a copper substrate, by attaching the sheet to a carrier (e.g. PMMA) and etching away the copper. The carrier allows deposition of the sheet on a substrate, after which the carrier itself is removed, e.g. by dissolving with acetone in the case of PMMA. However, when applied to the construction of a single functional microdevice, this technique will cause considerable waste of graphene material as only a small portion of the sheet is used.

SUMMARY OF THE INVENTION

A method is provided for transferring a graphene sheet to metal contact bumps of a substrate that is to be used in a semiconductor device package, i.e. a stack of substrates connected by said contact bumps. In particular the method is relevant for copper contact bumps for which graphene forms a protective layer. According to a method of certain embodiments, an imprinter device is used comprising an imprinter substrate, said substrate being provided with cavities, whereof each cavity is provided with a rim portion. The imprinter substrate is aligned with the substrate comprising the bumps and lowered onto said substrate so that each bump becomes enclosed by a cavity, until the rim portion of the cavities cuts through the graphene sheet, leaving graphene layer portions on top of each of bumps when the imprinter is removed. The graphene sheet is preferably attached to the substrate by imprinting it into a passivation layer surrounding the bumps. The embodiments are also related to an imprinter device as such, and to methods of debonding substrates of which the bumps are covered by a graphene layer.

The embodiments are related to methods and devices as disclosed in the appended claims. Firstly, the embodiments are related to a method for transferring a sheet of graphene to a metal contact bump, comprising the steps of:

providing a substrate comprising one or more of said metal contact bumps on its surface, said bumps being surrounded by a passivation layer, i.e. covering an area around and immediately adjacent to each of said bumps, placing a sheet of graphene on said substrate, said sheet covering said one or more bumps, aligning an imprinter device with respect to said substrate, the imprinter device comprising an imprinter substrate having a front surface that is provided with one or more cavities through the front surface, each cavity being provided with a rim portion, the number of cavities being at least the same as the number of bumps, wherein aligning means that the imprinter device is positioned so that each of said bumps is aligned with one of said cavities, lowering the imprinter device with respect to the substrate so that each of the bumps becomes enclosed within a corresponding cavity, thereby arranging said sheet of graphene in contact with the top and side surfaces of said bump, pushing down the imprinter device until said rim portion cuts through the graphene sheet, lifting up the imprinter device, leaving a graphene sheet portion attached to said substrate and covering each of the bumps, with unattached graphene sheet portions remaining on the substrate in between the bumps, and removing said unattached graphene sheet portions by a cleaning step.

According to an embodiment, said rim portion is protruding outward with respect to said front surface of the imprinter substrate.

Said metal bumps are preferably copper bumps. According to an embodiment, said rim portion of each of said cavities is pushed into the surface of the passivation layer, imprinting said rim portion into said passivation layer, and thereby attaching said graphene sheet portions to said passivation layer.

Said substrate may be is an integrated circuit or a substrate configured for receiving a plurality of integrated circuits on its surface.

The embodiments are equally related to an imprinter device suitable for use in a method of certain embodiments. In such an imprinter device, said imprinter substrate may be a metal substrate, a silicon substrate or a silicon substrate with a silicon nitride layer provided on said silicon substrate.

The embodiments are equally related to a method for debonding a stack of two substrates, each substrate being provided with metal contact bumps, wherein the bumps of at least one substrate are covered with a graphene sheet portion, and wherein the bumps of one substrate are in contact with the bumps of the other substrate, and wherein the two substrates are held together by a removable bonding means, said debonding method consisting in removing said bonding means, whereby contact between said contact bumps is released and the two substrates are fully separated.

In the method for debonding according to certain embodiments, said bonding means may be a cured underfill layer, and wherein the step of removing the bonding means consists of dissolving said cured underfill layer.

Alternatively, said bonding means may be a plurality of solidified solder balls, and wherein the step of removing the bonding means consists of heating and melting said solder balls.

BRIEF DESCRIPTION OF THE FIGURES

FIGS. 4A and 4B illustrate how a connection between copper bumps covered by a graphene layer can be separated.

DETAILED DESCRIPTION OF THE INVENTION

Figure 1A:
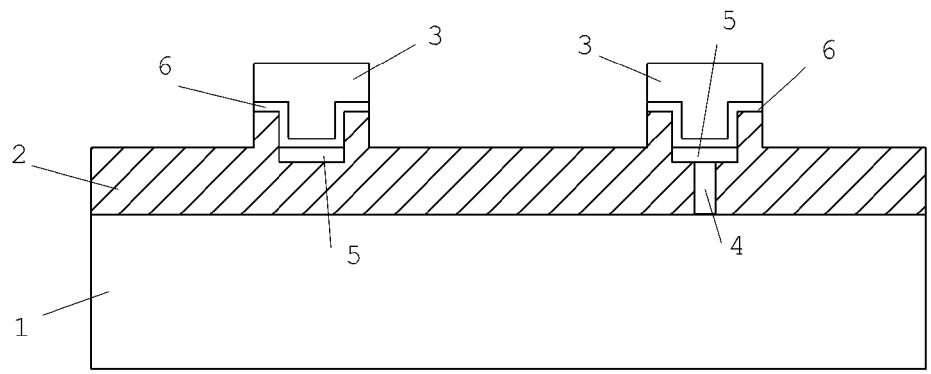
FIGS. 1A to 1F illustrate the steps of the method according to an embodiment.

FIG. 1A shows a substrate to which a method of an embodiment may be applied. This may be for example a silicon wafer 1 comprising one or more integrated circuits and a metallization stack for connecting said ICs to an external power source. The ICs and metallization are not shown in the drawing. A passivation layer 2 is present on top of the ICs and metallization, and metal bumps 3, preferably copper bumps are present on top of the passivation layer. The passivation layer may be BCB or a polyimide film for example. A general requirement for the passivation layer according to a preferred embodiment, is that this layer is deformable to such a degree that the imprinter device (see further) may be imprinted into the surface of this layer, i.e. the layer is sufficiently 'soft' for a patterned substrate to make an imprint on its surface. Metal connections 4 are present between at least some of the bumps 3 and the device wafer 1. The bumps 3 are seated on a contact pad 5, with a barrier+seed layer 6 (i.e. stack of barrier and seed layer) separating the bump from the pad and the passivation layer, the barrier layer serving to avoid copper contamination of the ICs; the seed layer serves as the basis for initiating the growth of the Cu bump. These elements as such are known in the art, as are the processes and materials suitable for producing them. A preferred process for fabricating the structure of FIG. 1A uses electroplated bumps 3 deposited on the pads 5 after first applying and patterning a resist layer by standard photolithography.

Figure 1B:
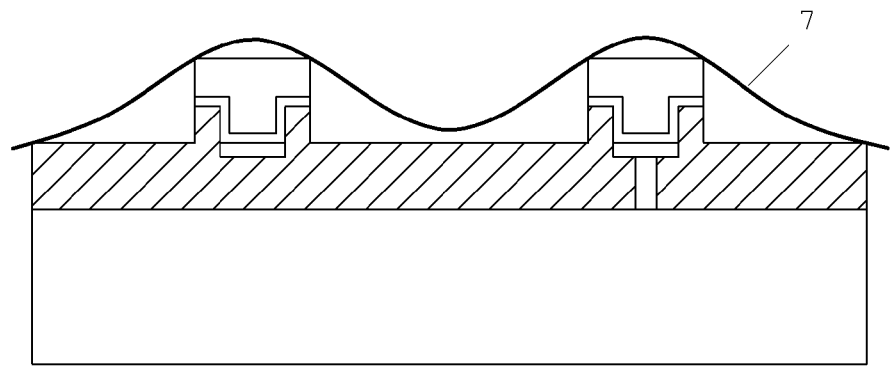

A graphene sheet 7 is then provided and placed over the bumps 3, see FIG. 1B. The sheet may be produced in any known manner, for example by CVD (Chemical Vapor Deposition) on a copper substrate.

Figure 1C:
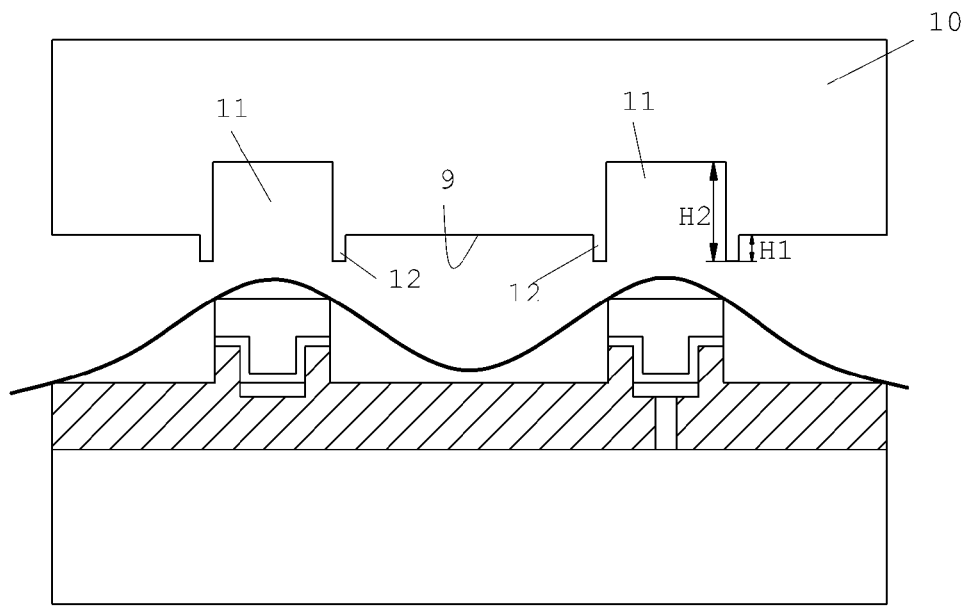

According to certain embodiments, the graphene is attached to the copper bumps in the following manner. A specifically designed imprinter device is aligned with the wafer (FIG. 1C). The imprinter device consists of or comprises an imprinter substrate 10 with a pattern of cavities 11 through its front surface 9. The pattern of cavities corresponds to the pattern of the bumps 3, so that when the imprinter substrate 10 and the substrate 1 are aligned, each of the bumps 3 is facing one of the cavities 11. According to the preferred embodiment, the cavities 11 are dimensioned so as to fit closely over the copper bumps 3 with a minimal tolerance in terms of the distance between the side walls of the cavities and the side walls of the bumps.

The distance between the side wall of the bump 3 and the inner vertical wall of the cavity 11 may depend on the thickness of the graphene sheet. For example, said distance may be twice the thickness of the graphene sheet. The graphene sheet may be a single layer or multiple layer sheet, which should be taken into account in designing the dimensions of the cavities with respect to the bumps. The embodiments are relevant for any bump diameter, bump height and bump pitch, ranging from a few nm to hundreds of microns (for each of the parameters diameter, height and pitch), and to any shape of the bumps. The sizing of the cavities is therefore dependent on each particular case, and it is within the skill of the skilled person to determine a suitable cavity size capable of arranging the graphene sheet so that it fully covers the metal bump.

The edge of the cavities 11 is provided with a rim 12 which is protruding outward from the imprinter's front surface 9, in the direction of the bumps when the imprinter is aligned with the wafer. The rim 12 protrudes from the imprinter's surface 9 over a distance H1. The depth H2 of the cavities, measured from the bottom of the cavities to the top of the rim 12 is higher than the height of the bumps 3, as measured from the surface of the passivation layer 2.

Figure 1D:
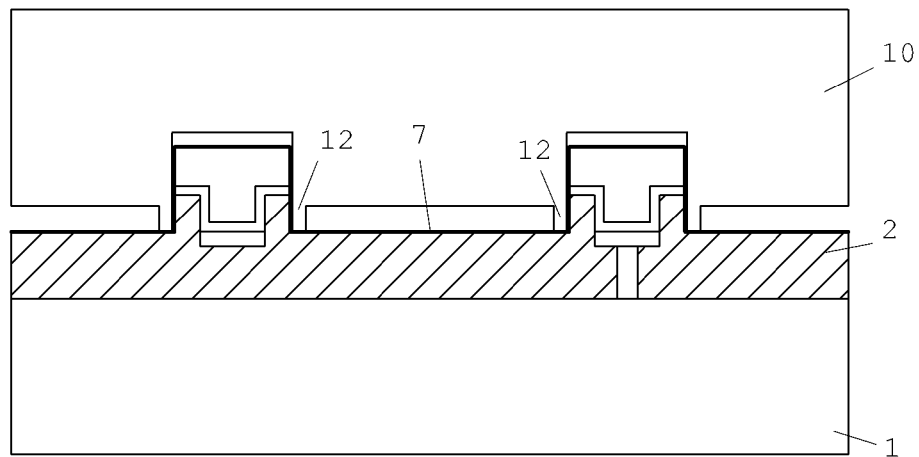
Figure 1E:
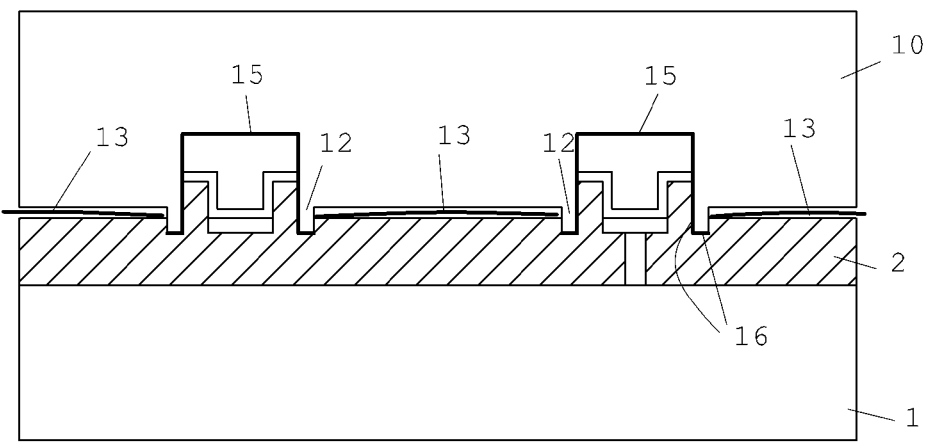

As shown in FIG. 1D, the imprinter substrate 10 is lowered until each of the bumps 3 is enclosed within one of the cavities 11, and the rim 12 comes into contact with the surface of the passivation layer 2. This causes the graphene sheet 7 to be closely arranged around the bumps. By further exerting a force on the imprinter substrate, the rim protrusions 12 are imprinted into the surface of the passivation layer 2, see FIG. 1E, thereby cutting through the graphene on said surface of the passivation layer 2. The bottom of the cavity may come in contact with the top of the bump at the end of the imprinting step, but this is not a requirement. The imprinting step may be regarded as finished as soon as the graphene sheet is cut.

Figure 1F:
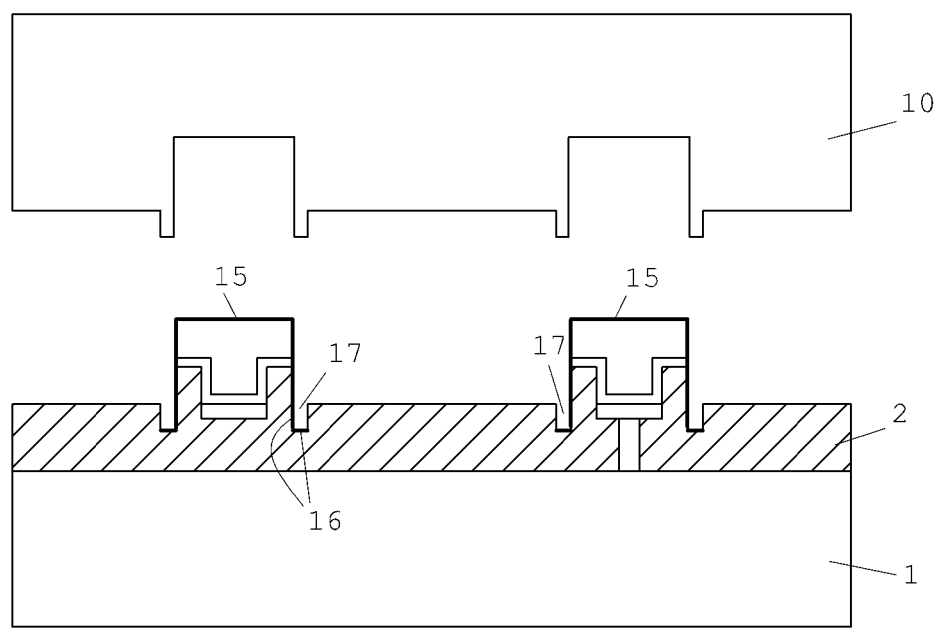

Loose portions 13 of the sheet remain on the surface of the passivation layer 2. When the imprinter is lifted again, graphene sheet portions 15 (hereafter also referred to as graphene layers 15) remain on top of and on the side walls of the bumps (FIG. 1F). According to an embodiment, the graphene layer 15 is held in place by the portion 16 which has been pushed into the passivation layer 2 by the imprinter's rim 12, i.e. the graphene portion 16 that remains on the bottom and inner side wall of the ring-shaped indentation 17 made by the rim 12 (see FIGS. 1E and 1F). The portion that is actually holding the graphene in place may be the portion at the bottom of the indentation 17 or at the sidewall of the indentation or both. The material of the passivation layer 2, the shape of the rim portion 12 and the imprinting force are such that this portion 16 becomes attached to the passivation layer 2 to thereby hold the graphene onto the bump when the imprinter is removed. The shape of the rim 12 may be designed so that it cuts through the graphene only on the outer side wall of said indentation 17. The loose portions 13 of the sheet can be removed by a dry or wet cleaning method, and possibly recycled for re-use in other applications.

The manipulation of the imprinter substrate 10 with respect to the wafer, hereafter referred to as the imprinting step, may be executed as a bonding step known as such in the art. This manipulation may therefore be done in a bonding tool as known in the art, such as an EVG®520 bonder or a thermal compression bonder FC150 or FC300 from Smart Equipment Technologies. The imprinting step may be performed at room temperature or under high temperature, preferably in the temperature range between 25° C. and 1000° C. The imprinting force may be anywhere between 50 MPa and 1000 MPa.

The imprinter substrate 10 may be produced from any suitable material. For example, the imprinter substrate may be produced from a steel substrate, by a technique known from the domain of stencil printing, e.g. by chemical etching or laser cutting. According to another embodiment, the imprinter substrate is produced from a silicon substrate, or a multilayer substrate, for example a silicon substrate provided with a silicon nitride passivation layer. In the latter case, it is possible to start from a blanket Si+SiN substrate and then make the cavities through the SiN layer, or from a Si-substrate into which cavities are made and then a SiN layer is deposited conformally into the cavities.

Figure 2:
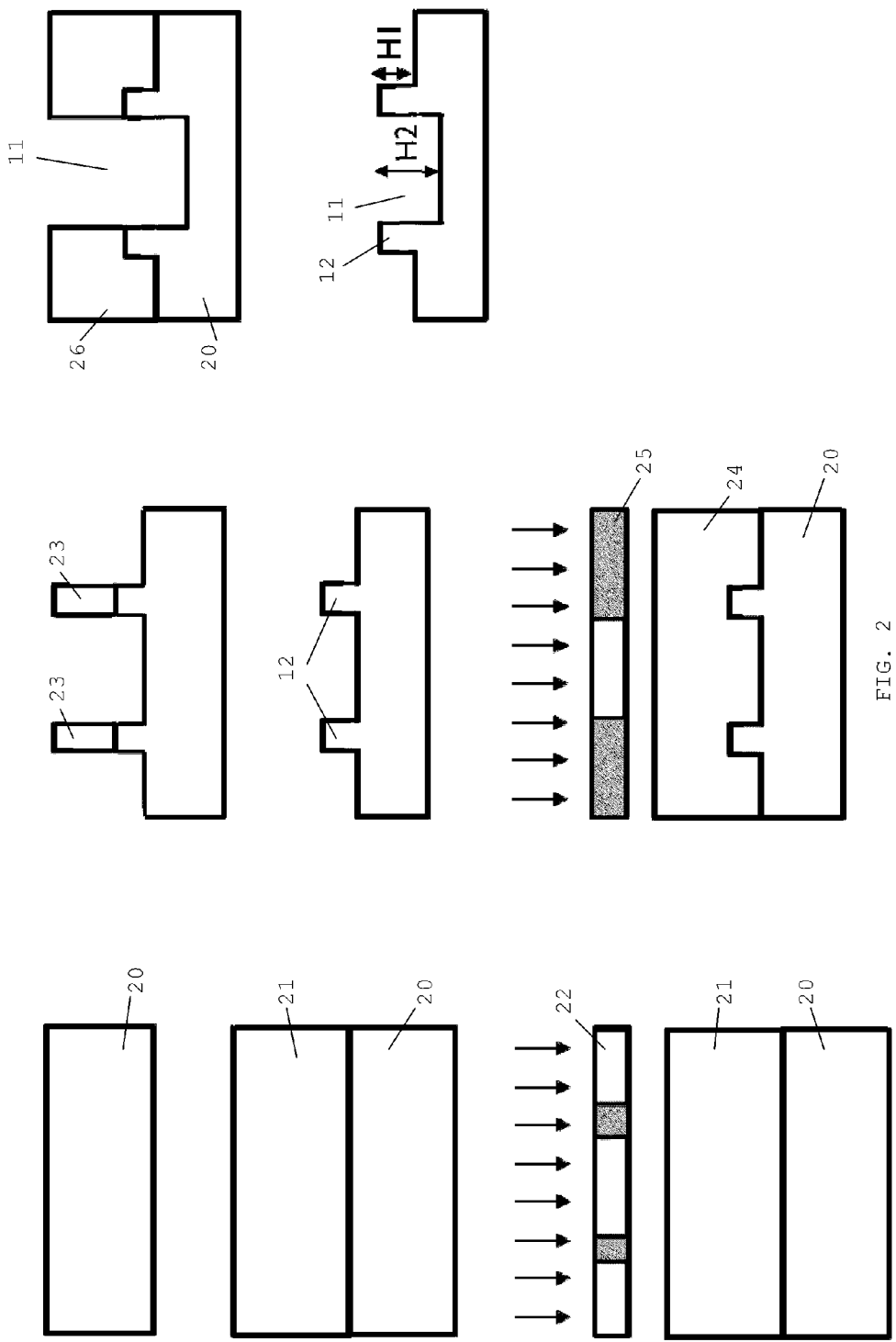
FIG. 2 illustrates a method for producing an imprinter device.

FIG. 2 illustrates a possible method for producing the imprinter substrate 10, starting from a silicon substrate 20. After a pre-cleaning step, a photoresist layer 21 is coated onto the silicon substrate. The resist is exposed to light through a photomask 22 after which exposed resist is removed, a resist mask 23 remains and the silicon substrate is etched in the areas not covered by said mask 23. After stripping the resist mask, a patterned silicon surface is obtained, exhibiting a protruding rim 12 of height H1. Then, a second resist layer 24 is deposited and patterned through a second photomask 25 to form a second resist mask 26, allowing the etching of the cavities 11 with depth H2, concentrically with the rim 12. According to a preferred embodiment, H1 is smaller than H2.

Figure 3A:
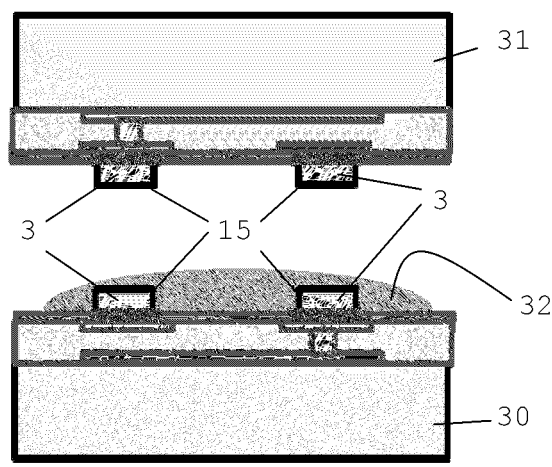
FIGS. 3A to 3C illustrate the bonding process for attaching two substrates, each provided with copper bumps covered by a graphene layer.
Figure 3B:
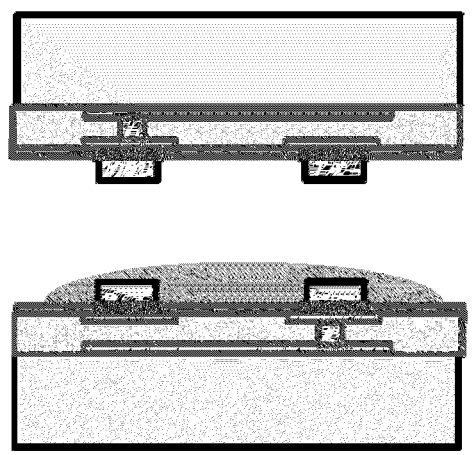
Figure 3C:
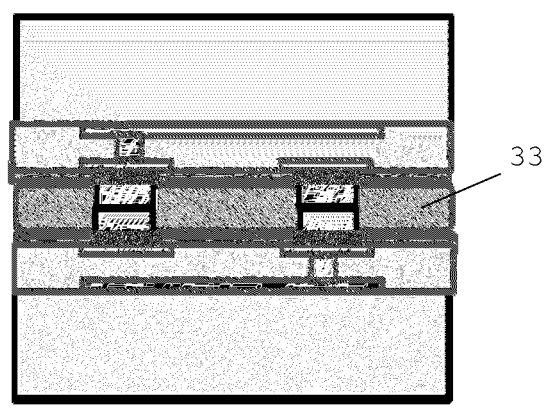

The embodiments are equally related to methods for bonding and de-bonding two bumps 3 of which at least one is provided with a graphene sheet. As shown in FIG. 3A, the bonding process may take place by aligning two substrates 30 and 31, for example two IC's or one IC and a carrier substrate, each one provided with metal bumps 3, covered by graphene layers 15, preferably produced according to the method described above. A layer 32 of underfill material is placed on the lower substrate 30 before the top substrate 31 is lowered onto said lower substrate so that the bumps are in contact (FIG. 3B). This assembly is then subjected to a curing step for hardening the underfill material to from a hardened layer 33 (FIG. 3C), preferably while exerting a contact pressure on the bumps 3. When no graphene layer is present, the assembly is further subjected to a post-bonding anneal, so that an alloy is formed between the materials of the respective bumps and/or of a solder layer applied on one or both bumps prior to bonding. When a graphene layer 15 is applied on the bumps, however, the graphene forms a barrier for the copper diffusion that is required for forming the alloys, hence no alloys can be formed. In other words, the connection is made only by the contact between the two bumps, said contact being maintained by the hardened underfill layer 33 holding the bumps in place. This means that when the underfill material is removed, the substrates 30/31 can be separated again, as illustrated in FIG. 4A. Most types of underfill material (e.g. epoxy-based) can be removed by dissolving the material. This may be useful for example when the substrates need to be separated for repair purposes.

An alternative for establishing the connection between two substrates 30 and 31 provided with copper bumps 3 is a solder connection with solder balls 40, as illustrated in FIG. 4B. Such solder balls are known for example for establishing I/O connections between an IC and a carrier substrate, so the process for producing such a solder ball connection is not described here in detail. These solder balls 40 are typically present at the periphery of the substrates that are to be connected (or at least at the periphery of the smallest of the two substrates). Again, the copper bumps 3 are not forming a single body through diffusion of copper, due to the presence of the graphene sheet 15. So when the solder balls 40 are heated to higher than the melting temperature of the solder material, the substrates can be separated, as illustrated in FIG. 4B.

Some alternatives of the above-described embodiments are included as other embodiments. Instead of a single sheet 7 of graphene, a smaller sheet of graphene may be placed over each bump 3 separately.

Figure 5:
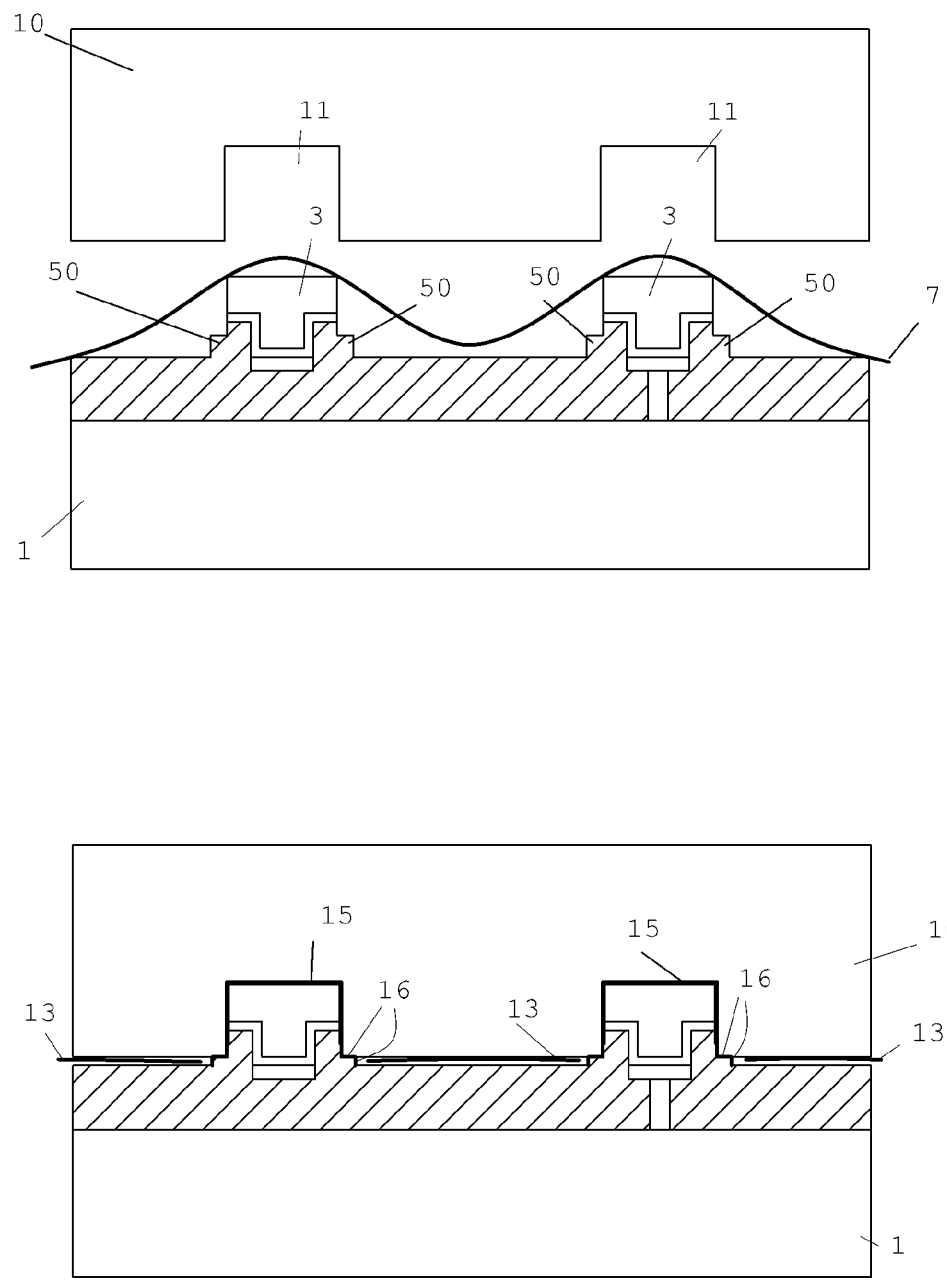
FIG. 5 illustrates two steps of the method according to a preferred embodiment, wherein said rim portion is not protruding outward with respect to said front surface of the imprinter substrate.

The shape of the rim portion 12 may be different from the protruding ring-shaped portion shown in the drawings. The rim portion may be a protruding ring with a cross-section other than a rectangular cross-section. According to an embodiment, the rim portion does not protrude outwards with respect to the imprinter substrate's front surface 9, but it is formed by a sufficiently sharp edge of the cavity 11, possibly in combination with a specifically patterned passivation layer 2 so that said layer forms a step feature 50 around the bumps into which the straight edge may be imprinted, to thereby cut off the graphene sheet (see FIG. 5), and attach the graphene sheet portions 15 to the passivation layer 2 by portions 16 (or at least a part of said portions 16) of said sheet.

While the invention has been illustrated and described in detail in the drawings and foregoing description, such illustration and description are to be considered illustrative or exemplary and not restrictive. Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

The foregoing description details certain embodiments of the invention. It will be appreciated, however, that no matter how detailed the foregoing appears in text, the invention may be practiced in many ways, and is therefore not limited to the embodiments disclosed. It should be noted that the use of particular terminology when describing certain features or aspects of the invention should not be taken to imply that the terminology is being re-defined herein to be restricted to include any specific characteristics of the features or aspects of the invention with which that terminology is associated.

Unless specifically specified, the description of a layer being deposited or produced 'on' another layer or substrate, includes the options of said layer being produced or deposited directly on, i.e. in contact with, said other layer or substrate, and said layer being produced on one or a stack of intermediate layers between said layer and said other layer or substrate.

All references cited herein are incorporated herein by reference in their entirety. To the extent publications and patents or patent applications incorporated by reference contradict the disclosure contained in the specification, the specification is intended to supersede and/or take precedence over any such contradictory material.

Unless otherwise defined, all terms (including technical and scientific terms) are to be given their ordinary and customary meaning to a person of ordinary skill in the art, and are not to be limited to a special or customized meaning unless expressly so defined herein. It should be noted that the use of particular terminology when describing certain features or aspects of the disclosure should not be taken to imply that the terminology is being re-defined herein to be restricted to include any specific characteristics of the features or aspects of the disclosure with which that terminology is associated. Terms and phrases used in this application, and variations thereof, especially in the appended claims, unless otherwise expressly stated, should be construed as open ended as opposed to limiting. As examples of the foregoing, the term 'including' should be read to mean 'including, without limitation,' 'including but not limited to,' or the like; the term 'comprising' as used herein is synonymous with 'including,' 'containing,' or 'characterized by,' and is inclusive or open-ended and does not exclude additional, unrecited elements or method steps; the term 'having' should be interpreted as 'having at least;' the term 'includes' should be interpreted as 'includes but is not limited to;' the term 'example' is used to provide exemplary instances of the item in discussion, not an exhaustive or limiting list thereof; adjectives such as 'known', 'normal', 'standard', and terms of similar meaning should not be construed as limiting the item described to a given time period or to an item available as of a given time, but instead should be read to encompass known, normal, or standard technologies that may be available or known now or at any time in the future; and use of terms like 'preferably,' 'preferred,' 'desired,' or 'desirable,' and words of similar meaning should not be understood as implying that certain features are critical, essential, or even important to the structure or function of the invention, but instead as merely intended to highlight alternative or additional features that may or may not be utilized in a particular embodiment of the invention. Likewise, a group of items linked with the conjunction 'and' should not be read as requiring that each and every one of those items be present in the grouping, but rather should be read as 'and/or' unless expressly stated otherwise. Similarly, a group of items linked with the conjunction 'or' should not be read as requiring mutual exclusivity among that group, but rather should be read as 'and/or' unless expressly stated otherwise.

Where a range of values is provided, it is understood that the upper and lower limit, and each intervening value between the upper and lower limit of the range is encompassed within the embodiments.

It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

All numbers expressing quantities, conditions, and so forth used in the specification are to be understood as being modified in all instances by the term 'about.' Accordingly, unless indicated to the contrary, the numerical parameters set forth herein are approximations that may vary depending upon the desired properties sought to be obtained. At the very least, and not as an attempt to limit the application of the doctrine of equivalents to the scope of any claims in any application claiming priority to the present application, each numerical parameter should be construed in light of the number of significant digits and ordinary rounding approaches.

Furthermore, although the foregoing has been described in some detail by way of illustrations and examples for purposes of clarity and understanding, it is apparent to those skilled in the art that certain changes and modifications may be practiced. Therefore, the description and examples should not be construed as limiting the scope of the invention to the specific embodiments and examples described herein, but rather to also cover all modification and alternatives coming with the true scope and spirit of the invention.

What is claimed is:

1. A method for transferring a sheet of graphene to a metal contact bump, comprising:
    providing a substrate comprising one or more metal contact bumps on a surface of the substrate, the metal contact bumps being surrounded by a passivation layer;
    placing a sheet of graphene on the substrate, the sheet of graphene covering the one or more metal contact bumps,
    aligning an imprinter device with respect to the substrate, the imprinter device comprising an imprinter substrate having a front surface that is provided with one or more cavities through the front surface, each cavity having a rim portion, wherein a number of the one or more cavities is at least the same as a number of the one or more metal contact bumps, wherein the imprinter device is positioned so that each of the one or more metal contact bumps is aligned with one of the cavities;

lowering the imprinter device with respect to the substrate so that each of the one or more metal contact bumps becomes enclosed within a corresponding cavity, thereby arranging the sheet of graphene such that it is in contact with top and side surfaces of the one or more metal contact bumps;

pushing down the imprinter device until each rim portion cuts through the sheet of graphene;

lifting up the imprinter device, so as to leave a graphene sheet portion attached to the substrate and covering each of the one or more metal contact bumps, with unattached graphene sheet portions remaining on the substrate in between each of the one or more metal contact bumps; and removing the unattached graphene sheet portions by cleaning.

2. The method according to claim 1, wherein each rim portion protrudes outward with respect to said the surface of the imprinter substrate.

3. The method according to claim 1, wherein the one or more metal contact bumps are copper bumps.

4. The method according to claim 1, wherein each rim portion is pushed into a surface of the passivation layer, thereby imprinting each rim portion into the passivation layer, and thereby attaching the graphene sheet portions to the passivation layer.

5. The method according to claim 1, wherein the substrate is an integrated circuit or a substrate configured for receiving a plurality of integrated circuits on its surface.

6. The method according to claim 1, wherein the imprinter substrate is selected from the group consisting of a metal substrate, a silicon substrate, and a silicon substrate with a silicon nitride layer provided on thereon.

* * * * *